United States Patent
Do

(10) Patent No.: US 7,522,459 B2
(45) Date of Patent: Apr. 21, 2009

(54) DATA INPUT CIRCUIT OF SEMICONDUCTOR MEMORY DEVICE

(75) Inventor: Chang-Ho Do, Kyoungki-do (KR)

(73) Assignee: Hynix Semiconductor Inc., Kyoungki-Do (KR)

( * ) Notice: Subject to any disclaimer, the term of this patent is extended or adjusted under 35 U.S.C. 154(b) by 330 days.

(21) Appl. No.: 11/477,948

(22) Filed: Jun. 30, 2006

(65) Prior Publication Data

US 2006/0245101 A1    Nov. 2, 2006

(30) Foreign Application Priority Data

Sep. 29, 2005   (KR) .................. 10-2005-0090919
Mar. 22, 2006   (KR) .................. 10-2006-0026260

(51) Int. Cl.
    *G11C 7/10*   (2006.01)
(52) U.S. Cl. ............. 365/193; 365/189.05; 365/189.16; 365/219
(58) Field of Classification Search .......... 365/219
    See application file for complete search history.

(56) References Cited

U.S. PATENT DOCUMENTS

| | | | |
|---|---|---|---|
| 5,661,692 A | 8/1997 | Pinkham et al. | |
| 5,959,900 A | 9/1999 | Matsubara | |
| 6,067,613 A | 5/2000 | Balmer | |
| 6,215,726 B1 * | 4/2001 | Kubo | 365/233.17 |
| 6,317,372 B1 * | 11/2001 | Hayashi et al. | 365/201 |
| 6,434,661 B1 | 8/2002 | Konishi et al. | |
| 6,510,095 B1 * | 1/2003 | Matsuzaki et al. | 365/222 |
| 6,552,955 B1 * | 4/2003 | Miki | 365/233.1 |
| 6,708,255 B2 | 3/2004 | Yi | |
| 6,717,887 B1 * | 4/2004 | Kono et al. | 365/189.14 |
| 6,947,334 B2 * | 9/2005 | Shin | 365/189.16 |
| 7,016,237 B2 * | 3/2006 | Lee et al. | 365/189.05 |
| 7,287,143 B2 * | 10/2007 | Lee et al. | 711/167 |
| 2004/0114423 A1 | 6/2004 | La | |
| 2004/0213073 A1 * | 10/2004 | Yoon et al. | 365/233 |
| 2004/0246783 A1 * | 12/2004 | Lee et al. | 365/189.05 |

FOREIGN PATENT DOCUMENTS

| | | |
|---|---|---|
| KR | 10-2004-0018215 A | 3/2004 |
| KR | 10-2004-0104286 A | 12/2004 |
| TW | 541537 | 7/2003 |
| TW | 579522 | 3/2004 |

OTHER PUBLICATIONS

Korean Office Action, with English Translation, issued in corresponding Korean Patent Application No. KR 10-2006-0026260, issued on Nov. 28, 2007.

(Continued)

*Primary Examiner*—Tan T. Nguyen
(74) *Attorney, Agent, or Firm*—McDermott Will & Emery LLP

(57) ABSTRACT

An input circuit can minimize a circuit area required for data prefetch operation for an increased bit number of prefetch data. A control signal generating unit generates a plurality of control signals in response to a clock signal and a data strobe signal, wherein external data are input in synchronism with the data strobe signal. A synchronizing unit for aligns the input data into N-bit data in parallel by performing a data alignment operation at least three times, N being a positive integer larger than one.

69 Claims, 7 Drawing Sheets

OTHER PUBLICATIONS

Taiwanese Office Action, with English translation, issued in Taiwanese Patent Application No. TW 095123982, mailed Jul. 30, 2008.

Chinese Office Action, w/English translation thereof, issued in Chinese Patent Application No. 200610151866.8 dated Nov. 21, 2008.

* cited by examiner

DATA INPUT CIRCUIT OF SEMICONDUCTOR MEMORY DEVICE

FIELD OF THE INVENTION

The present invention relates to a semiconductor memory device, and more particularly to a data input circuit of the semiconductor memory device.

DESCRIPTION OF RELATED ART

Generally, a semiconductor memory device performs a data prefetch operation in order to increase data access time. The data prefetch operation is one method for internally transferring data in response to a write command. Typically, a data input circuit of the semiconductor memory device performs the data prefetch operation in synchronization with a system clock. The data input circuit prefetches some data, i.e., 2-bit data, 4 bit data and 8 bit data input in response to the write command.

As the semiconductor memory device is required to operate with higher speeds, the bit number of data to be prefetched increases. Double data rate synchronized dynamic random access memories (DDR SDRAM) have evolved from a 2-bit prefetch operation is used for the data access to 4 bit prefetch operation and recently to 8 bit prefetch operation.

The data input circuit commonly includes a plurality of circuits, i.e., latches whose number corresponds to the bit number of data to be prefetched.

FIG. 1 is a block diagram of a prior art data input circuit for 2-bit prefetch of a semiconductor memory device.

The data input circuit includes a buffer unit 10 for receiving data DQ from the external device, a synchronizing control unit 20 for generating a plurality of synchronizing control signals DSRP, DSFP and DSTROB, and a synchronizing unit 30 for synchronizing an output of the buffer unit 10 with the plurality of synchronizing control signals DSRP, DSFP and DSTROB to output aligned data DIO_OR and DIO_OF.

The buffer unit 10 includes a buffer 12 for receiving the data from the external device and a delay unit 14 for delaying an output of the buffer 12 for a predetermined time and providing the delayed data to synchronizing unit 30.

The synchronizing control unit 20 includes a buffer 21 for receiving a data strobe signal DQS and a reference signal VREF, a driver 22 for receiving an output of the buffer 21 to output the first and the second synchronizing control signals DSRP and DSFP, a buffer 24 for receiving a clock signal CLK and a inverted clock signal/CLK, a driver 25 for driving an output of the driver 25 to output an internal clock signal ICLK and a signal generator 26 for receiving the internal clock signal ICLK and an enable signal EN to generate the third synchronizing control signal DSTROB.

The third synchronizing control signal DSTROB is generated by logically combining the internal clock signal ICLK and the enable signal EN. After 2-bit data is input into and aligned in the data input circuit, the aligned 2-bit data are synchronized with a system clock, i.e., the clock signal CLK. The enable signal EN is generated from a circuit for carrying out an operation in response to a write command and then provided to the signal generator 26.

The synchronizing unit 30 includes an alignment unit 32 for aligning outputs of the buffer unit 10 in response to the first and the second synchronizing control signals DSRP and DSFP, a domain cross unit 36 for synchronizing outputs of the alignment unit 32 with the third synchronizing control signal DSTROB to output the aligned data DIO_OR and DIO_OF.

The alignment unit 32 includes a first latch 33 for latching the output of the buffer unit 10 in response to the first synchronizing control signal DSRP, a second latch 34 for latching an output of the first latch 33 in response to the second synchronizing control signal DSFP and the third latch 35 for latching the output of the buffer unit 10 respectively in response to the second synchronizing control signal DSFP.

The domain cross unit 36 includes a fourth latch 37 for latching an output of the second latch 34 to output the aligned data DIO_OR and a fifth latch 38 for latching an output of the third latch 35 to output the aligned data DIO_OF, wherein the fourth and the fifth latches 37 and 38 perform the latching operation in response to the third synchroning control signal DSTROB.

FIG. 2 is a timing diagram for an operation of the conventional data input circuit shown in FIG. 1.

Hereinafter, the operation of the conventional data input circuit will be described referring to FIGS. 1 and 2.

The buffer unit 10 receives data 0R and 0F from the external device and outputs internal data DIN. The data 0R and 0F are respectively input into the buffer unit 10 in a state of being synchronized with a rising timing and a falling timing of the data strobe signal DQS. The data 0R is a first input data input into the buffer unit 10 in response to the first rising transition timing of the data strobe signal DQS. The data 0F is a second input data input into the buffer unit 10 in response to the first falling transition timing of the data strobe signal DQS.

The synchronizing control unit 20 receives the data strobe signal DQS and the reference signal VREF and generates the first and the second synchronizing control signals DSRP and DSFP, respectively being synchronized with the rising timing and the falling timing of the data strobe signal DQS.

The first latch 33 of the alignment unit 32 latches the internal data DIN, i.e., the data 0R, in response to the first synchronizing control signal DSRP. The second latch 34 latches the output of the first latch 33 in response to the second synchronizing control signal DSFP. The third latch 35 latches the internal data DIN, i.e., the data 0F, in response to the second synchronizing control signal DSRF. That is, the sequentially input data 0R and 0F are latched in parallel at the second latch 34 and the third latch 35, respectively.

The synchronizing control unit 20 generates the third synchronizing control signal DSTROB synchronized with the internal clock ICLK in response to the activated enable signal EN.

The enable signal EN is activated in response to a rising transition timing of the clock signal CLK when the inputting of data begins and is inactivated in response to the next rising transition timing of the clock signal CLK.

The latches 37 and 38 of the domain cross unit 36 latch, respectively, the outputs F0_R and F0_F of latches 34 and 35 in response to the third synchronizing control signal DSTROB and output the aligned data DIO_OR and DIO_OF, respectively. The aligned data DIO_OR and DIO_OF are data aligned in synchronism with the clock signal CLK since the third synchronizing control signal DSTROB is synchronized with the internal clock signal ICLK.

For reference, the word "domain crossing" means an operation for changing a referential signal to a transfer signal. In above description, the data strobe signal DQS is changed into the clock signal CLK as the referential signal for transferring data.

Generally, in a DDR SDRAM, all internal operations of a core area are performed in synchronism with the clock signal CLK. Therefore, the data input circuit performs a domain crossing operation that changes the data strobe signal DQS into the clock signal CLK as the referential signal for transferring data.

FIG. 3 is a block diagram of a prior art data input circuit for 4-bit prefetch of a semiconductor memory device The data input circuit includes a buffer unit 40, a synchronizing control unit 50 and a synchronizing unit 60. The data input circuit for 4-bit prefetch has substantially the same constitution as the data input circuit for 2-bit prefetch shown in FIG. 1. The number of latches arranged in the synchronizing unit 60 is greater than that of the synchronizing unit 30 in FIG. 1. That is because the synchronizing unit 60 latches and aligns 4-bit data input in series, which are synchronized with a rising timing or a falling timing of the data strobe signal DQS.

The synchronizing control unit 50 generates the first and the second synchronizing control signals DSRP and DSFP in response to the data strobe signal DQS and the third synchronizing control signals DSTROB2 in response to the internal clock signal ICLK. After the latching operation of a latch unit 62, the third synchronizing control signal DSTROB2 is generated by the synchronizing control unit 50.

FIG. 4 is a timing diagram for an operation of the data input circuit shown in FIG. 3.

Hereinafter, the operation of the data input circuit for 4-bit prefetch will be described referring to FIGS. 3 and 4.

The buffer unit 40 receives data input from the external device and outputs internal data DIN.

The synchronizing control unit 50 receives the data strobe signal DQS and the reference signal VREF and generates the first and the second synchronizing control signals DSRP and DSFP, respectively synchronized with the rising timing and the falling timing of the data strobe signal DQS.

The alignment unit 62 aligns the internal 4-bit data DIN, i.e., a first data 0R, a second data 0F, a third data 1R and a fourth data 1F transferred sequentially in synchronism with the first and the second synchronizing control signals DSRP and DSFP into data R0_R, F0_F, F1_R and F1_F aligned as a type of two rows.

The synchronizing control unit 50 receives the clock signals CLK and /CLK and generates the third synchronizing control signal DSTROB2 in response to an enable signal EN2.

A domain crossing unit 66 latches the R0_R, F0_F, F1_R and F1_F and outputs as a aligned data DIO_0R, DIO_0F, DIO_1R and DIO_1F in synchronism with the third synchronizing control signal DSTROB2.

Therefore, the sequentially input 4-bit data 0R, 0F, 1R and 1F are aligned into the 4-bit aligned data DIO_0R, DIO_0F, DIO_1R and DIO_1F by a prefetch operation of the conventional data input circuit for 4-bit prefetch as shown in FIG. 4.

As described above, the data input circuit has a plurality of latches configured in two rows. At first, the data input circuit arranges all bit data into first data aligned one of two rows using latches and, secondly, rearranges the first data into second data aligned in parallel. The number of latches requested in order to arrange data input in series into data aligned in parallel is 2N-1+N, N being a positive integer. The 2N-1 latches are needed for the first arranging and the N latches are needed for the second arranging.

If the number of data bits for the prefetch operation increases, more latches may be needed. Therefore, a greater bit number for the prefetch operation is needed and a larger area is required for the data input circuit in the semiconductor memory device. The increase of the area of the data input circuit results in rising cost for fabricating the semiconductor memory device.

SUMMARY OF THE INVENTION

The present invention provides various embodiments for a data input circuit that can minimize a circuit area required for a prefetch operation although the bit number of data for the prefetch operation increases.

In accordance with a first embodiment of the present invention, there is provided an input circuit of a semiconductor memory device for N-bit prefetch including: a control signal generating unit for generating a plurality of control signals in response to a clock signal and a data strobe signal wherein externally input data are synchronized with the data strobe signal; and a synchronizing unit for aligning the input data into N-bit data aligned in parallel through greater than three data alignment operations, wherein the N is an integer number greater than two.

In accordance with a second embodiment of the present invention, there is provided an input circuit of a semiconductor memory device including: a control signal generating unit for generating a plurality of alignment control signals in response to a data strobe signal and a plurality of domain cross control signals in response to a clock signal wherein externally input data are synchronized with the data strobe signal; an alignment unit for aligning the N-bit input data into data aligned in parallel through greater than two data align operations; and a domain cross unit for synchronizing outputs of the alignment unit with the domain cross control signals to output N-bit aligned data in parallel, wherein the N is an integer number of two or greater.

In accordance with a third embodiment of the present invention, there is provided an input circuit of a semiconductor memory device, including: a control signal generating unit for generating first and second alignment control signals and a plurality of domain cross control signals in response to a clock signal and a data strobe signal wherein externally input data are synchronized with the data strobe signal; an alignment unit for aligning the N-bit input data into data aligned in two rows in response to the first and the second alignment control signals; and a domain cross unit for synchronizing the data aligned by the alignment unit with the plurality of domain cross control signals through two data synchronizing operations to output N-bit aligned data in parallel, wherein N is an integer number of two or greater.

In accordance with fourth embodiment the present invention, there is provided an input circuit of a semiconductor memory device for N-bit prefetch, including: a first data alignment unit for aligning and outputting a predetermined number of external N-bit data sequentially input in response to a first control signal in synchronism with a data strobe signal wherein the N-bit data input are synchronized with transition timing of the data strobe signal; a latch unit for latching an output of the data alignment unit in response to a second control signal in synchronism with a system clock; and a second alignment unit for aligning the aligned data by the data alignment unit and the latched data by the latch unit into N bit data aligned in parallel in response to a third control signal generated in synchronism with the system clock.

In accordance with a fifth embodiment of the present invention, there is provided an input circuit of a semiconductor memory device for N-bit prefetch including: a data alignment unit for aligning and outputting a predetermined number of external N-bit data sequentially input; a first domain cross unit for latching an output of the data alignment unit in response to a first domain cross control signal; and a second domain cross unit for latching the aligned data by the data alignment unit and the latched data by the first domain cross unit into a N-bit data aligned in parallel in response to a second domain cross control signal.

In accordance with a sixth embodiment of the present invention, there is provided a method for operating a semiconductor memory device for N-bit prefetch, including: aligning a predetermined number of M-bit data of external N-bit data sequentially input into a first M-bit data aligned in parallel using an alignment unit; latching the first M-bit data into second data; aligning the other data of the N-bit data into third data in parallel using the alignment unit; and aligning the second data and the third data into N-bit data aligned in parallel.

BRIEF DESCRIPTION OF THE DRAWINGS

The above and other objects and features of the present invention will become apparent from the following description of preferred embodiments taken in conjunction with the accompanying drawings, in which.

DETAILED DESCRIPTION OF THE INVENTION

Hereinafter, a data input circuit for 8-bit prefetch of a semiconductor memory device in accordance with the present invention will be described in detail referring to the accompanying drawings.

Figure 1:
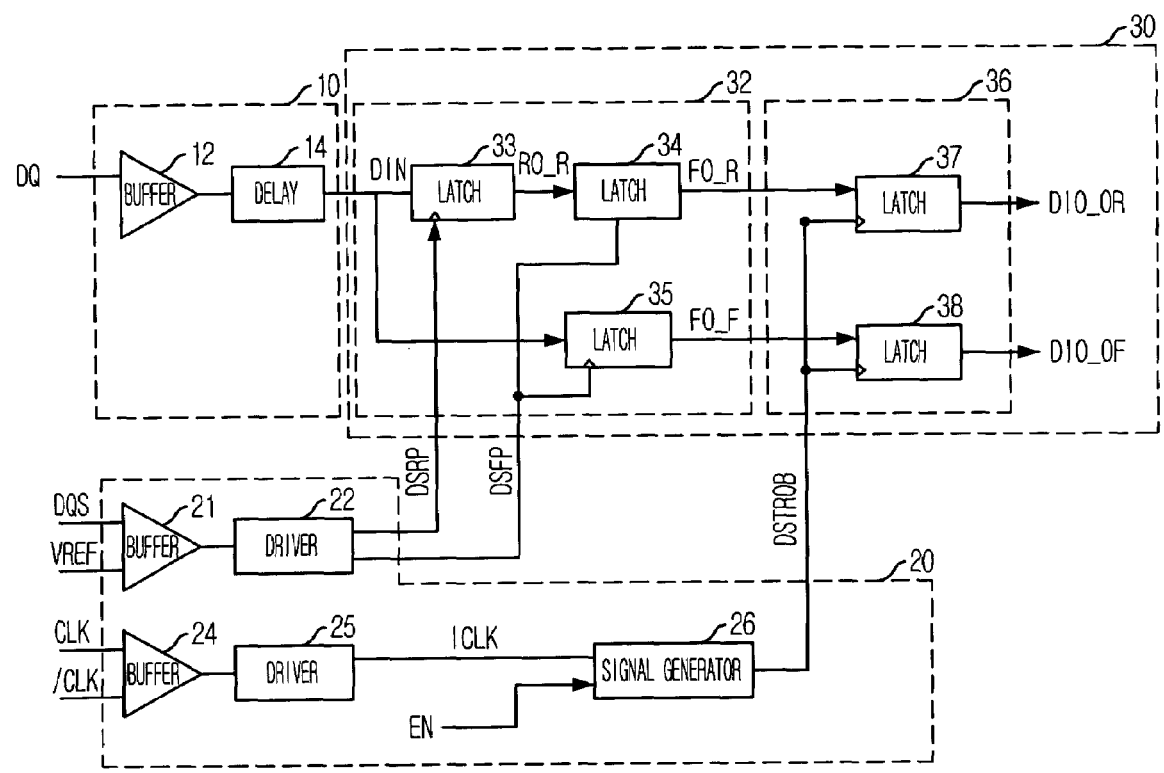
FIG. 1 is a block diagram of a conventional data input circuit for 2-bit prefetch of a semiconductor memory device.
Figure 2:
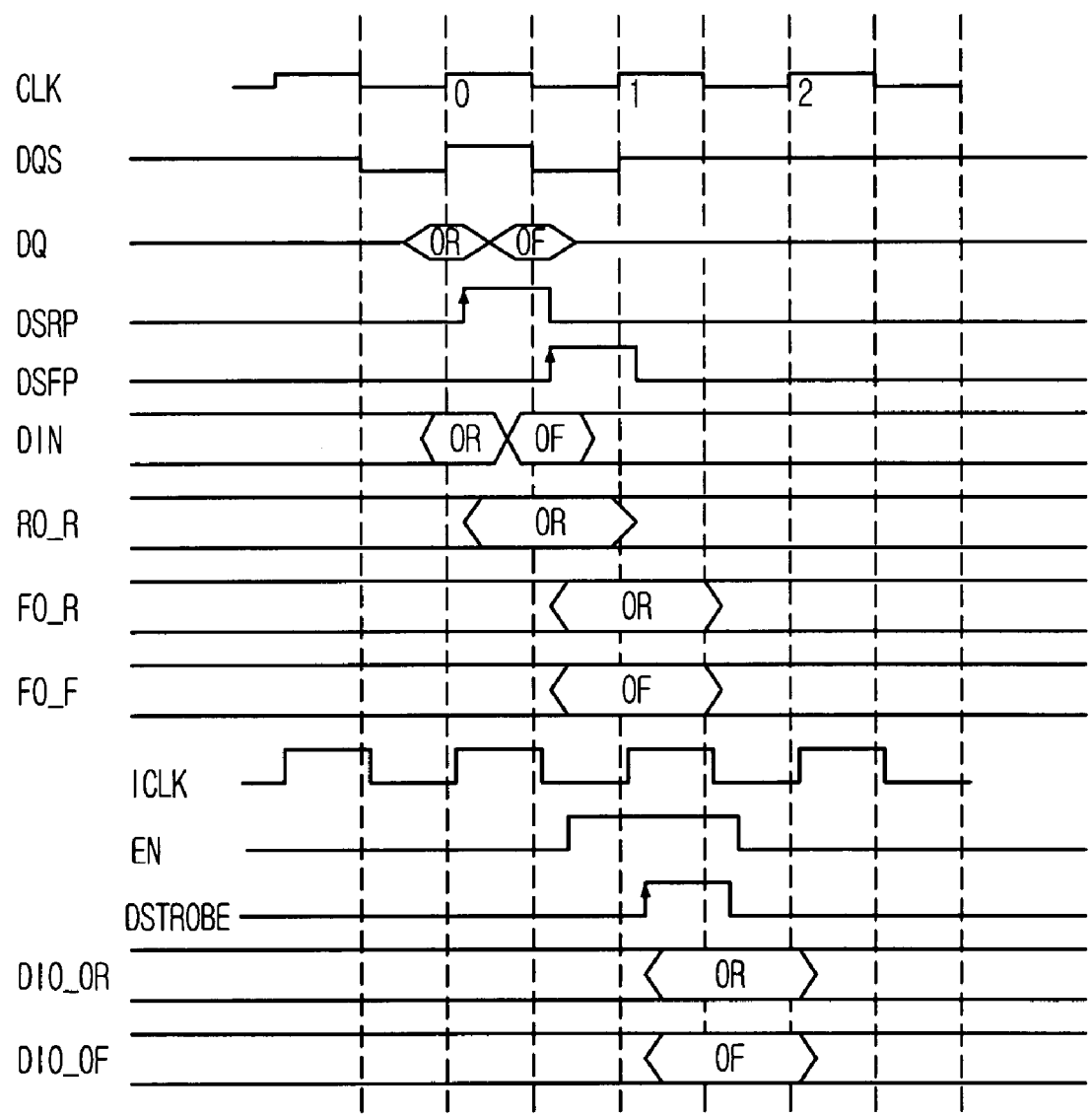
FIG. 2 is a timing diagram of an operation of the conventional data input circuit shown in FIG. 1.
Figure 3:
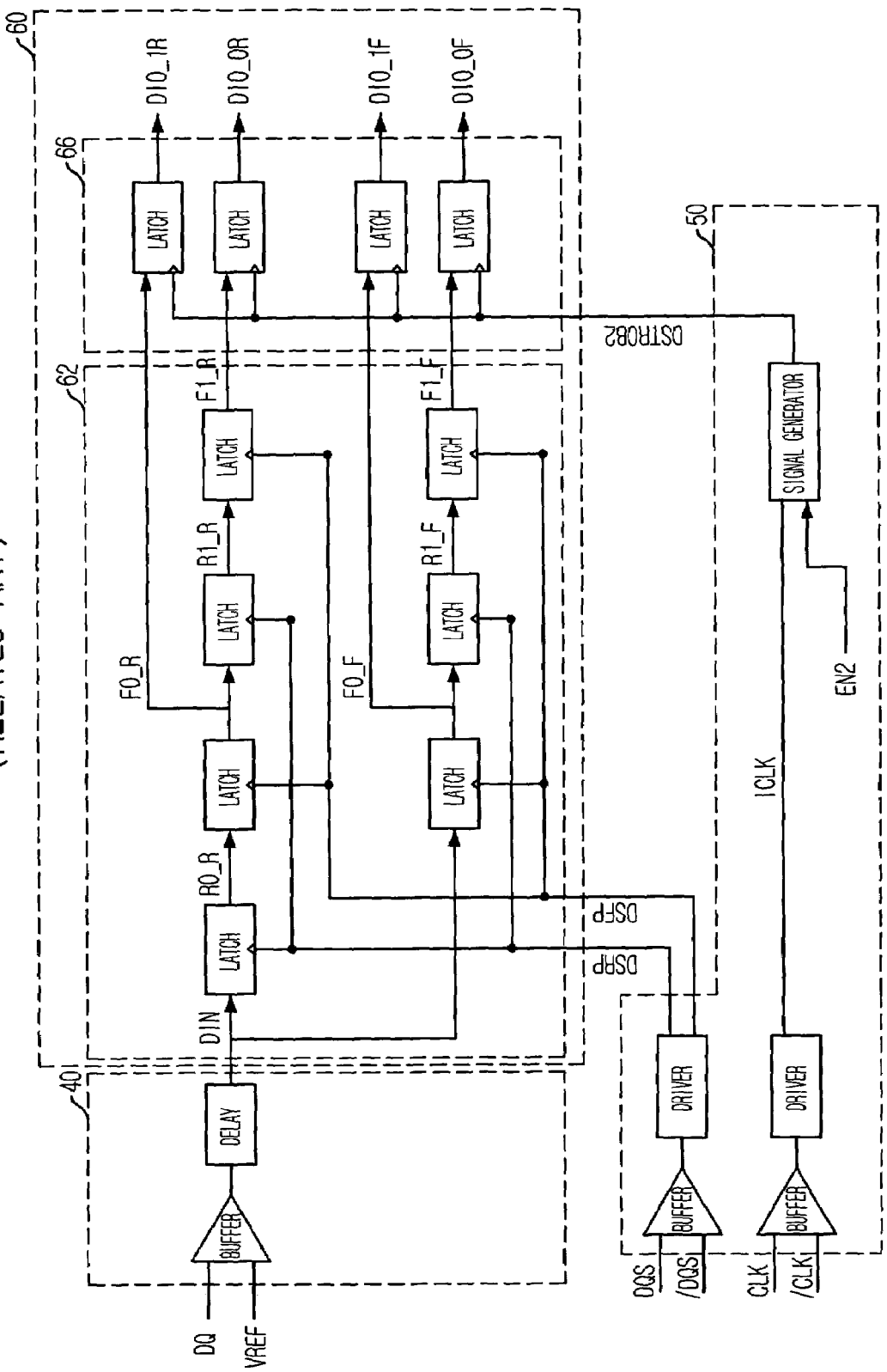
FIG. 3 is a block diagram of a conventional data input circuit for 4-bit prefetch of a semiconductor memory device.
Figure 4:
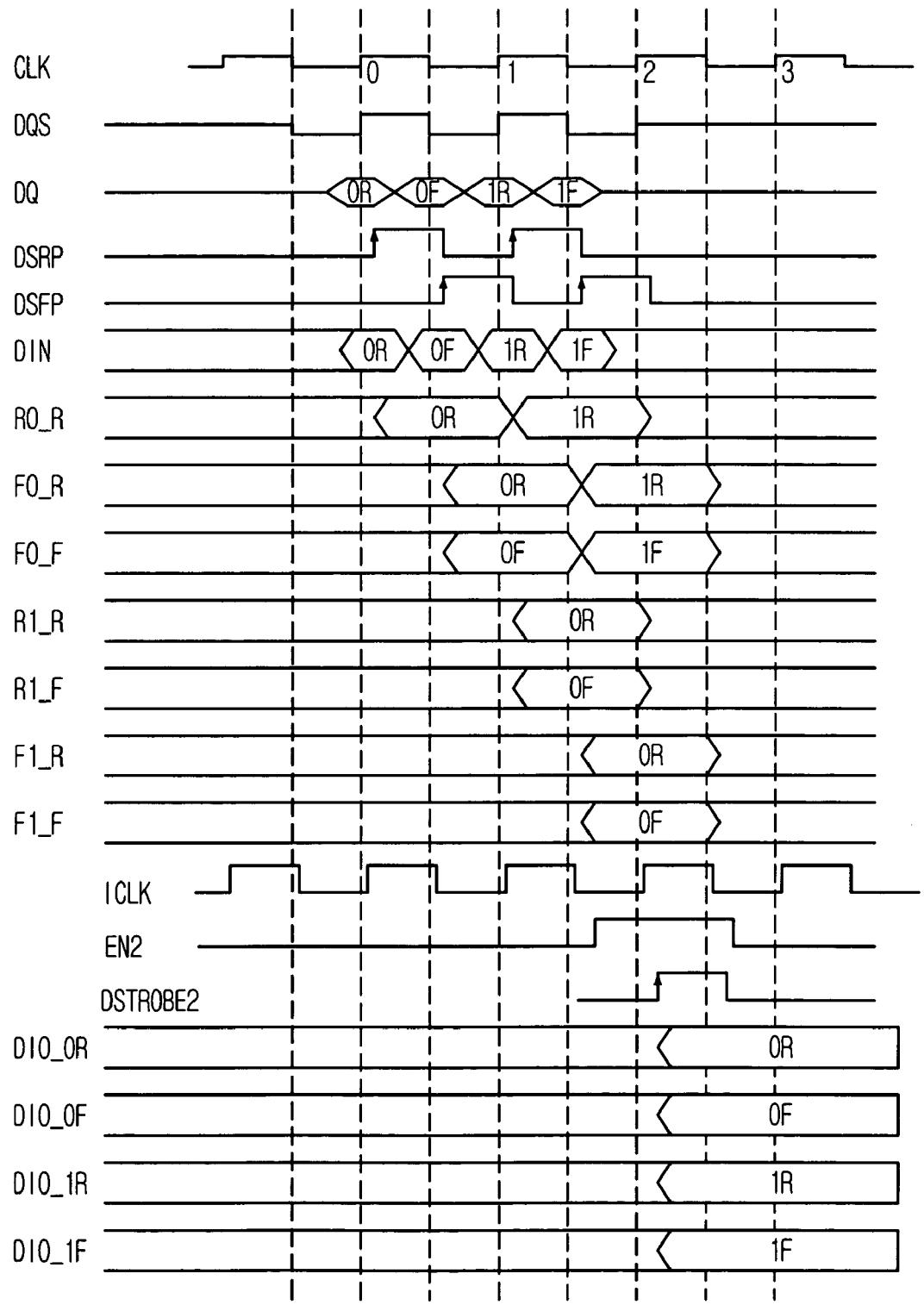
FIG. 4 is a timing diagram of an operation of the data input circuit as shown FIG. 3.
Figure 5:
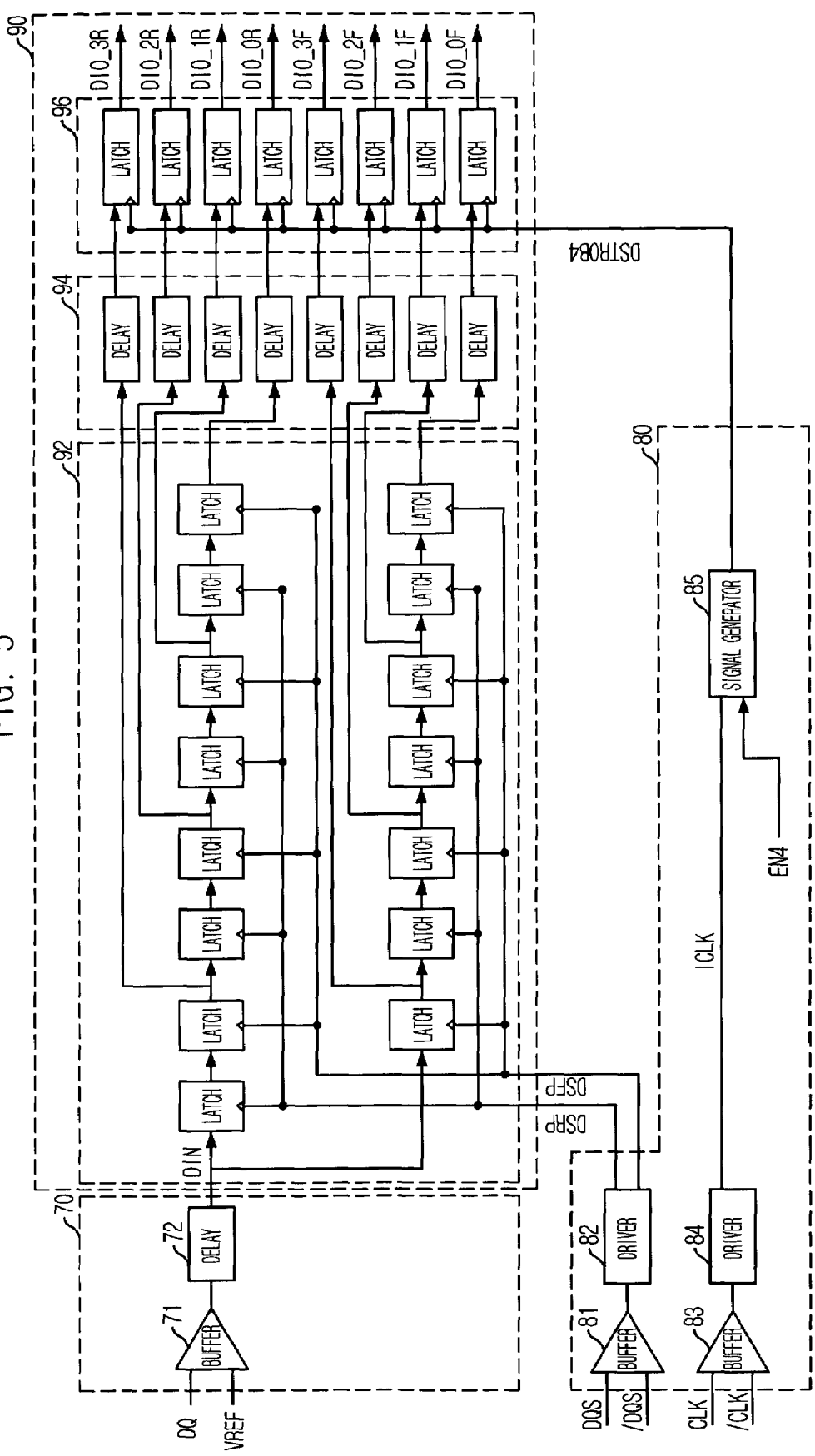
FIG. 5 is a block diagram of a data input circuit for 8-bit prefetch of a semiconductor memory device in accordance with a specific embodiment of the present invention.

FIG. 5 is a block diagram of a data input circuit for 8-bit prefetch of a semiconductor memory device in accordance with a first embodiment of the present invention.

As shown in FIG. 5, the data input circuit for operating 8-bit prefetch includes a buffer unit 70, a synchronizing control unit 80 and a synchronizing unit 90.

The buffer unit 70 includes a buffer 71 for receiving the data DQ from external device and a delay unit 72 for delaying an output of the buffer 71 for a predetermined time to output as an internal data DIN into the synchronizing unit 90.

The synchronizing control unit 80 includes a buffer 81 for receiving data strobe signals DQS and /DQS, a driver 82 for receiving a output of the buffer 81 to respectively output as the first and the second synchronizing control signals DSRP and DSFP, a buffer 83 for receiving a clock signals CLK and /CLK, a driver 84 for driving an output of the inverter 83 to output as an internal clock signal ICLK and a signal generator 85 for receiving the internal clock signal ICLK and an enable signal EN to generate the third synchronizing control signal DSTROB4.

The synchronizing unit 90 includes an alignment unit 92, a delay unit 94 and a domain cross unit 96.

The alignment unit 92 aligns the internal data DIN into data aligned in two rows. The delay unit 94 delays an output of the alignment unit 92 for a predetermined time to output into the delay unit 94. Herein, the predetermined time is a time given for increasing insufficient operating margin that results in domain cross from a short difference between transition timing of the data strobe signal DQS and transition timing of the clock signals CLK and /CLK. For The difference is called tDQSS with reference to DDR SDRAM.

The alignment unit 92 includes a total of fifteen latches. The fifteen latches of the alignment unit 92 is arranged in order to align first data input sequentially in synchronism with transition timing of the data strobe signal DQS into second data aligned in two rows.

The delay unit 94 includes eight delays for delaying respectively the second data output from the alignment unit 92 to output as the third data into the domain cross unit 96.

The domain cross unit 96 includes eight latches for latching the third data output from the delay unit 94 to output 8-bit aligned parallel data DIO_0F, DIO_1F, DIO_2F, DIO_3F, DIO_0R, DIO_1R, DIO_2R and DIO_3R.

Therefore, the data input circuit for 8-bit prefetch aligns an 8-bit data, i.e., 0R, 0F, 1R, 1F, 2R, 2F, 3R and 3F input sequentially in synchronism with the transition timing of the data strobe signal DQS into the 8-bit aligned parallel data, i.e., DIO_0F, DIO_1F, DIO_2F, DIO_3F, DIO_0R, DIO_1R, DIO_2R and DIO_3R.

Herein, the first and the second synchronizing control signals DSRP and DSFP are activated sequentially four times, respectively. The third synchronizing control signal DSTROB is activated after the eighth data 3F are input into the data input circuit.

Figure 6:
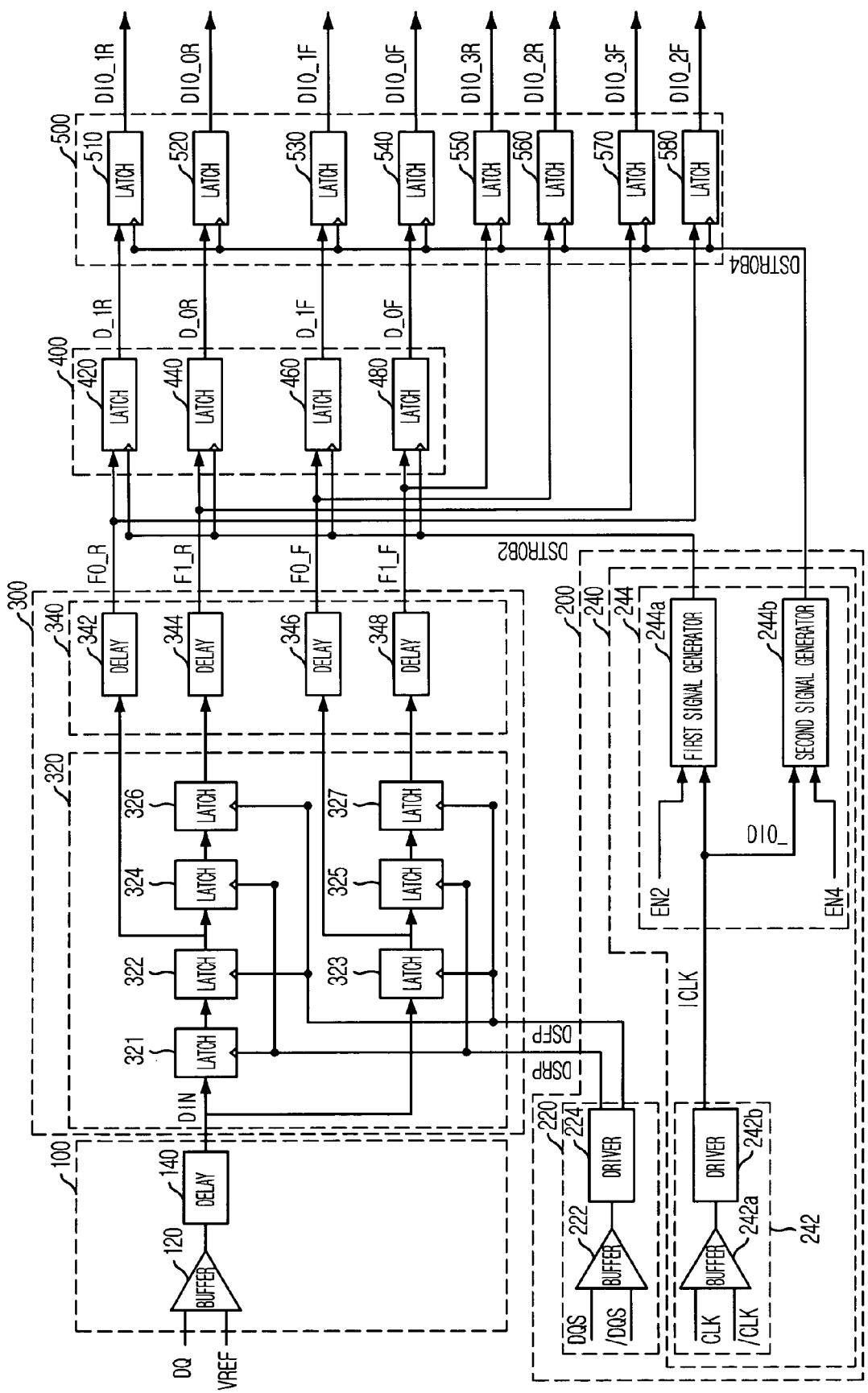
FIG. 6 is a block diagram of a data input circuit for 8-bit prefetch of a semiconductor memory device in accordance with another specific embodiment of the present invention.

FIG. 6 is a block diagram showing a data input circuit for 8-bit prefetch of a semiconductor memory device in accordance with a second embodiment of the present invention.

As shown in FIG. 6, the data input circuit for 8-bit prefetch includes a buffer unit 100 for receiving data DQ from the external device to output as internal data DIN, a synchronizing control unit 200 for receiving data strobe signals DQS and /DQS and clock signals CLK and /CLK to generate a plurality of control signals DSRP, DSFP, DSTROB2 and DSTROB4 and a synchronizing unit for synchronizing an output of the buffer unit 100 with the plurality of control signals DSRP, DSFP, DSTROB2 and DSTROB4 to output as 8-bit aligned data, i.e., DIO_0R, DIO_1R, DIO_2R, DIO_3R, DIO_0F, DIO_1F, DIO_2F and DIO_3F.

Herein, the synchronizing unit includes an alignment unit 300, a first domain cross unit 400 and a second domain cross unit 500. The synchronizing unit aligns the internal data DIN at first into aligned data in two rows and secondly into aligned data in four rows and then finally, into aligned 8-bit data in parallel. In detail, the alignment unit 300 aligns 8-bit data in series output from the buffer unit 100 into first 4-bit data in four rows and second 4-bit data in two rows in response to first and second synchronizing control signals DSRP and DSFP. The first domain cross unit 400 latches the first 4-bit data in four rows in response to a first domain cross control signals DSTROB2. After the first domain cross unit 400 latches the first 4-bit data, the second 4-bit data in two rows are transferred into the delay unit 340. The second domain cross unit 500 latches the first 4-bit data output from the first domain cross unit 400 and the second 4-bit data output from the alignment unit 300 to output as the aligned 8-bit parallel data, i.e., DIO_0R, DIO_1R, DIO_2R, DIO_3R, DIO_0F, DIO_1F, DIO_2F and DIO_3F in response to a second domain cross control signal DSTROB4.

The alignment unit 300 includes a latch unit 320 for aligning selected 4-bit data of 8-bit data output in series from the buffer unit 100 into the first 4-bit data in two rows and a delay unit 340 for receiving and delaying the first 4-bit data to output into the first domain cross unit 400.

The latch unit 320 includes seven latches 321 to 327 wherein the seven latches 321 to 327 are arranged two rows and latches, respectively, outputs of prior latches in response to the first or second synchronizing control signals DSRP and DSFP. The latch 321 and 323 latches the internal data DIN from the buffer unit 100.

In detail, the latch 321 latches the internal data DIN in response to the first synchronizing control signals DSRP. The latch 322 latches an output of the latch 321 in response to the second synchronizing control signals DSFP and outputs into the latch 324. The latch 323 latches the internal data DIN in response to the second synchronizing control signals DSFP. The latch 324 latches an output of latch 322 in response to the first synchronizing control signals DSRP. The latch 325 latches an output of latch 323 in response to the first synchronizing control signals DSRP. The latch 326 latches an output of latch 324 in response to the second synchronizing control signals DSFP. The latch 327 latches an output of latch 325 in response to the second synchronizing control signals DSFP. That is, the latches 321, 324 and 325 carry out a latch operation in response to the first synchronizing control signals DSRP, respectively. The latches 322, 323, 326 and 327 carry out a latch operation in response to the second synchronizing control signals DSFP, respectively.

The delay unit 340 unit includes four delays 342, 344, 346 and 348. The four delays 342, 344, 346 and 348 delay respectively the outputs of the latches 322, 326, 323 and 327 for a predetermined time to output into the first domain cross unit 400. The delay unit 340 can delay the data signals output from the latch unit 320 independently since the delay unit 340 has latches corresponding to signals transferred from latch unit 320. The four delay units 342, 344, 346 and 348 use a propagation delay by a plurality of inverters or RC delay value by a resistor and a capacitor for delay operation.

The first domain cross unit 400 includes four latches 420, 440, 460 and 480 for respectively latching the outputs of the fourth delays 342, 344, 346 and 348 in response to the first domain cross control signal DSTROB2.

The second domain cross unit 500 includes eight latches 510 to 580 for respectively latching the second 4-bit data output from the fourth delays 342, 344, 346 and 348 and the first 4-bit data output from four latches 420, 440, 460 and 480 in response to the second domain cross control signal DSTROB4.

A latch arranged in the alignment unit 300, the first domain cross unit 400 and the second domain cross unit 500 can be a D flip-flop and contain a circuit for performing edge triggering operation.

The synchronizing control unit 200 includes an alignment control unit 220 for generating the first and the second synchronizing control signals DSRP and DSFP in respective synchronism with a rising edge and a falling edge of the data strobe signal DQS and a domain cross control unit 240 for generating the first and the second domain cross control signals DSTROB2 and DSTROB4 in response to enable signals EN2 and EN4 and clock signals CLK and /CLK.

The alignment control unit 220 includes a buffer 222 for receiving the data strobe signals DQS and /DQS and a driver 224 for receiving an output of the buffer 222 and generating the first and the second synchronizing control signals DSRP and DSFP.

The domain cross control unit 240 includes a clock input unit 242 for receiving the clock signal CLK and the inverted clock signal /CLK and generating the internal clock ICLK and a domain cross control signal generating unit 244 for generating a first domain cross control signal DSTROB2 in synchronism with the internal clock ICLK in response to enable signals EN2 and a second domain cross control signal DSTROB4 in synchronism with the internal clock ICLK in response to enable signals EN4.

The clock input unit 242 includes a buffer 242a for receiving the clock signal CLK and the inverted clock signal /CLK and a driver 242a for receiving an output of the buffer 242a and generating the internal clock ICLK.

The domain cross control signal generating unit 244 includes a first generating unit 244a for generating the first domain cross control signal DSTROB2 in synchronism with the internal clock ICLK in response to the enable signal EN2 and a second generating unit 244b for generating the second domain cross control signal DSTROB4 in synchronism with the internal clock ICLK in response to the enable signal EN4.

The first generating unit 244a performs a logical operation of the internal clock ICLK and the enable signals EN2 to generate the first domain cross control signal DSTROB2. The second generating unit 244b performs a logical operation of the internal clock ICLK and the enable signal EN4 to generate the second domain cross control signal DSTROB4.

The enable signals EN2 and EN4 are generated by a control circuit performing an operation in response to a write command and are activated and inactivated in response to the internal clock signal ICLK.

Figure 7:
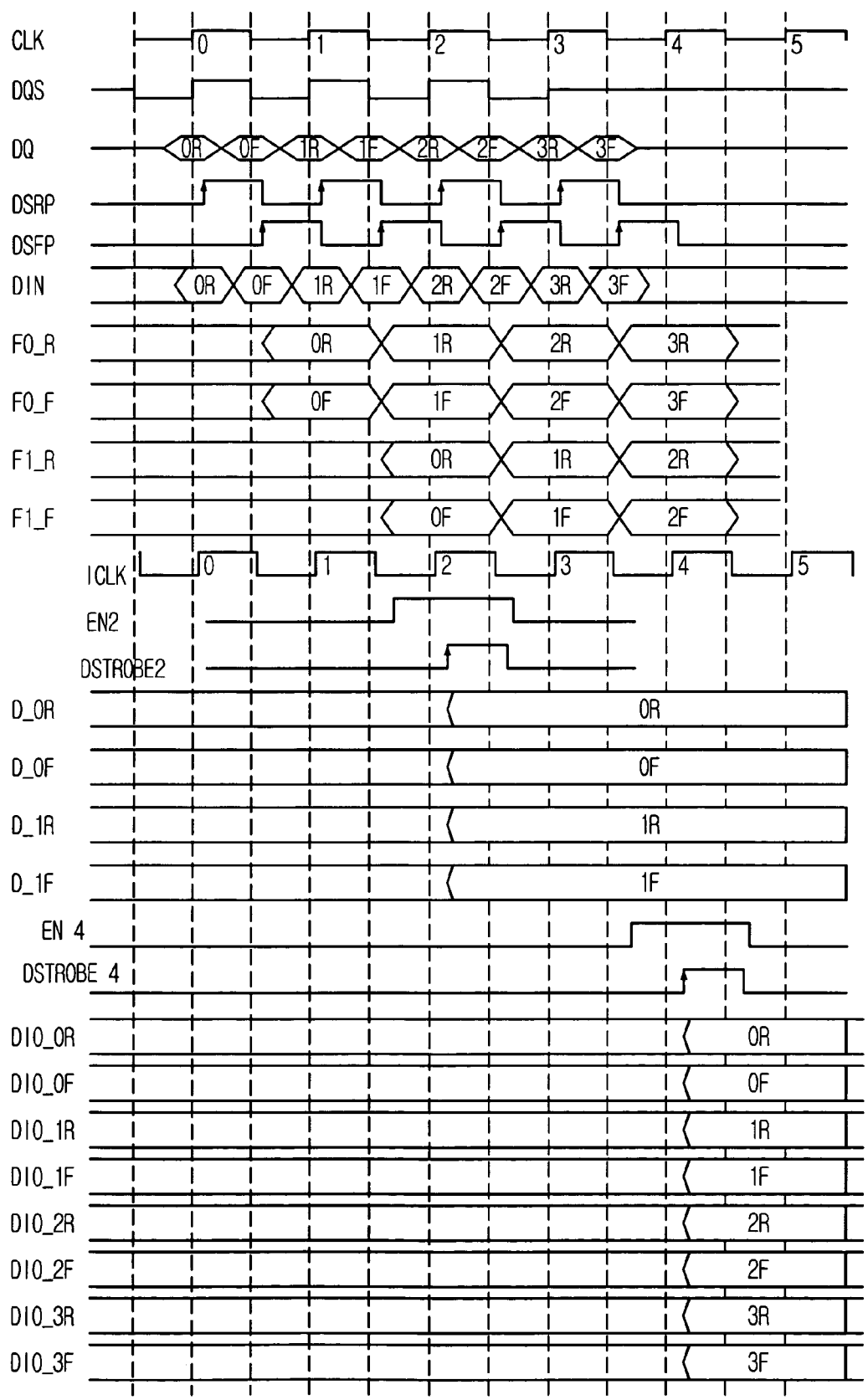
FIG. 7 is a timing diagram of an operation of the data input circuit shown in FIG. 6.

FIG. 7 is a timing diagram illustrating an operation of the data input circuit as shown FIG. 6. Hereinafter, the data input circuit for 8-bit prefetch in accordance with the second embodiment of the present invention will be described referring to FIG. 6 and FIG. 7.

Herein, 'R' and 'F' in FIG. 7 are abbreviations to distinguish data input respectively in synchronism with a rising edge and a falling edge of the data strobe signal DQS. The natural number in front of 'R' and 'F' in FIG. 7 means input order of data.

As shown in FIG. 7, at first data are sequentially input into the input buffer unit 100 in synchroniism with the rising edge and the falling edge of the data strobe signal DQS.

The input buffer 100 receives the external data input and outputs the same as internal data DIN.

The alignment control unit 220 generates the first and the second synchronizing control signals DSRP and DSFP, respectively, in synchronism with a rising edge and a falling edge of the data strobe signal DQS. Since the second embodiment of the present invention receives 8-bit data, the first and the second synchronizing control signals DSRP and DSFP have four transition times, respectively.

The latch unit 320 of the alignment unit 300 latches first 4-bit data of the input 8-bit data in two rows in response to the first and the second synchronizing control signals DSRP and DSFP. That is, the latch unit 320 latches 4-bit data, i.e., 0R, 0F, 1R and 1F input sequentially in two rows using the latches 321 to 327 in response to the first and the second synchronizing control signals DSRP and DSFP.

The delay unit 340 delays the latched data, i.e., 0R, 0F, 1R and 1F by the latches 322, 326, 323 and 327 to output as the output F0_R, F1_R, F0_R and F1_F into the first domain cross unit 400.

In addition, the domain cross control unit 240 generates the first domain cross control signal DSTROPB2 in synchronism with the internal clock signal ICLK when the enable signal EN2 is activated in response to the input timing of fourth data, i.e., 1F.

The first domain cross unit 400 latches the output F0_R, F1_R, F0_R and F1_F of the delay unit 340 to output as the output D_1R, D_0R, D_1F and D_0F in response to the first domain cross control signal DSTROPB2. Therefore, 4-bit data, i.e., 0R, 0F, 1R and 1F input sequentially are aligned as 4-bit data in parallel by the first domain cross unit 400.

While the first 4-bit data of the 8-bit data sequentially input are latched at the first domain cross unit 400, the latch unit 320 of the alignment unit 300 latches the other 4-bit data of the input 8-bit data in two rows in response to the first and the second synchronizing control signals DSRP and DSFP. That is, the latch unit 320 latches 4-bit data, i.e., 2R, 2F, 3R and 3F input sequentially in two rows using the latches 321 to 327 in response to the first and the second synchronizing control signals DSRP and DSFP.

The delay unit 340 delays the latched data, i.e., 2R, 2F, 3R and 3F by the latches 322, 326, 323 and 327 to output as the output F0_R, F1_R, F0_R and F1_F.

In addition, the domain cross control unit 240 generates the second domain cross control signal DSTROPB4 in synchronism with the internal clock signal ICLK when the enable signal EN4 is activated in response to the input timing of eighth data, i.e., 3F.

The second domain cross unit 500 latches the output D_1R, D_0R, D_1F and D_0R of the first domain cross unit 400 to output as the output DIO_1R, DIO_OR, DIO_1F and DIO_OF and latches the output F0_R, F1_R, F0_F and F1_F of the delay unit 340 to output as the output DIO_2F, DIO_3F, DIO_2R and DIO_3R in response to the second domain cross control signal DSTROPB4. Therefore, 8-bit data, i.e., 0R, 0F, 1R, 1F, 2R, 2F, 3R and 3F input sequentially are aligned as 8-bit data in parallel by the second domain cross unit 500.

As described above, the data input circuit for 8-bit prefetch in accordance with a second embodiment of the present invention has two domain cross unit 400 and 500, and performs domain crossing operation twice. The first domain cross unit 400 aligns first 4-bit data of the input 8-bit data into the aligned 4-bit data in parallel in synchronism with the reference signal, i.e., the first domain cross control signal DSTROB2. The second domain cross unit 500 aligns the next 4-bit data of the input 8-bit and the aligned 4-bit data in the first domain cross unit 400 into the aligned 8-bit data in parallel in synchronism with the reference signal, i.e., the second domain cross control signal DSTROB2.

Because domain cross operation is performed twice, the number of latches in the alignment unit 300 can be reduced. In detail, the data input circuit for 8-bit prefetch in accordance with a first embodiment of the present invention has fifteen latches to align 8-bit data in series into 8-bit data in two rows. However, the data input circuit for 8-bit prefetch in accordance with a second embodiment of the present invention has only seven latches to align 4-bit data in series into 4-bit data in two rows. The alignment unit 300 aligns only 4-bit data in series of the input 8-bit data into 4-bit data in parallel with two domain crossing operations. Therefore, eight latches of the input circuit are no longer required.

In addition, with two domain crossing operations, the four additional latches 420, 440, 460 and 480 of the first domain cross unit 400 are needed as compared with that of the first embodiment.

Although these four additional latches are required, the total number of latches required in the data input circuit for 8-bit prefetch can be reduced. That is, the total number of latches changes 23 latches in the first embodiment to 19 latches in the second embodiment.

As the total number of latches is reduced, the area of the data input circuit for 8-bit prefetch can be reduced. As a result, the cost of the semiconductor having the input circuit for 8-bit prefetch can be cut down.

Although it is disclosed about the data input circuit for 8-bit prefetch in described above, it is possible to use various alternatives, modifications and equivalents. For example, those skilled in the art appreciate that the data input circuits for 4-bit prefetch, 16-bit prefetch or 32-bit prefetch can be employed in the context of any type of semiconductor memory device, or can be modified in the bit number for appropriately dividing an input entire data or can be modified in which control signal is selected for twice or more domain cross operation.

The present application contains subject matter related to Korean patent application No. 2005-90919 and 2006-26260 in the Korea Patent Office on Sep. 29, 2005 and Mar. 22, 2006 respectively, the entire contents of which being incorporated herein by reference.

While the present invention has been described with respect to the particular embodiments, it will be apparent to those skilled in the art that various changes and modifications may be made without departing from the spirit and scope of the invention as defined in the following claims.

What is claimed is:

1. An input circuit for N-bit prefetch in a semiconductor memory device, the input circuit comprising:
a control signal generating unit for generating a plurality of control signals in response to a clock signal and a data strobe signal, wherein external data are input in synchronism with the data strobe signal; and
a synchronizing unit for aligning the input data into N-bit data in parallel by performing a data alignment operation at least three times, N being a positive integer larger than one,
wherein the synchronizing unit includes:
a first synchronizing unit for aligning the input data into first aligned data in response to a first control signal and a second control signal in synchronism with the data strobe signal;
a second synchronizing unit for aligning an output of the first synchronizing unit into second aligned data in response to a third control signal in synchronism with the clock signal, and a third synchronizing unit for aligning an output of the first synchronizing unit and the second synchronizing unit into the N-bit data in parallel in response to a fourth control signal.

2. The input circuit of claim 1, wherein the synchronizing unit performs the data alignment operation five times; N/2 bits of the input data are aligned into first aligned data in two rows at the first time; the first aligned data are aligned into second aligned data in N/2 rows at the second time; the other N/2 bits of the input data are aligned into third aligned data in two rows at the third time; the third aligned data are aligned into fourth aligned data in N/2 rows at the fourth time; and the fourth aligned data and the second aligned data are together aligned into N-bit data in parallel at the fifth time.

3. The input circuit of claim 1, wherein the first synchronizing unit includes:
a latch unit for latching the input data into the first aligned data to output a first to N/2th transferred data in response to the first and the second control signals sequentially activated; and
a delay unit for delaying the first to N/2th transferred data and outputting the delayed data to the second synchronizing unit.

4. The input circuit of claim 3, wherein the latch unit includes
a plurality of latches arranged with two lines, each of the latches latching an output of its previous latch in response to the first control signal or the second control signal and the first latches of the two lines receiving the input data in common.

5. The input circuit of claim 4, wherein the delay unit includes N/2 delays for respectively delaying the outputs of the latch unit for a predetermined delay time.

6. The input circuit of claim 5, wherein the second synchronizing unit includes N/2 latches for latching outputs of the N/2 delays in the delay unit, respectively.

7. The input circuit of claim 6, wherein the third synchronizing unit includes N latches for respectively latching the outputs of the N/2 delays in the delay unit and outputs of the N/2 latches in the second synchronizing unit.

8. The input circuit of claim 7, wherein each latch of the first to the third synchronizing units is a D flip-flop or a circuit performing an edge triggering operation.

9. The input circuit of claim 8, wherein outputs of the plurality of latches in the first to third synchronizing units are delayed with different delay times by the plurality of delays arranged in the delay unit.

10. The input circuit of claim 9, wherein each delay in the delay unit includes a plurality of inverters connected in series.

11. The input circuit of claim 9, wherein each delay in the delay unit includes a resistor and a capacitor.

12. The input circuit of claim 8, further comprising: a buffer unit for receiving the input data to output internal data into the first synchronizing unit.

13. The input circuit of claim 12, wherein the control signal generating unit includes: an alignment control signal generating unit for generating the first control signal in synchronism with a rising edge of the data strobe signal and the second control signal in synchronism with a falling edge of the data strobe signal; and a domain cross control signal generating unit for generating the third control signal activated in response to a first enable signal and the fourth control signal activated in response to a second enable signal.

14. The input circuit of claim 13, wherein the domain cross control signal generating unit includes: an input unit for generating an internal clock signal in response to the external clock signal and the inverted external clock signal a first signal generating unit for generating the third control signal in response to the internal clock signal and the first enable signal; and a second signal generating unit for generating the fourth control signal in response to the internal clock signal and the second enable signal.

15. The input circuit of claim 14, wherein the first signal generating unit generates the third control signal by logically combining the internal clock signal and the first enable signal.

16. The input circuit of claim 15, wherein the input unit includes:
a buffer for receiving the clock signal and the inverted clock signal; and
a driver for outputting the internal clock signal based on an output of the buffer into the first signal generating unit and the second signal generating unit.

17. The input circuit of claim 13 wherein the alignment control signal generating unit includes: a buffer for receiving the data strobe signal and an inverted data strobe signal; and a driver for generating the first and the second control signals based on an output of the buffer.

18. An input circuit of a semiconductor memory device, the input circuit comprising:
a control signal generating unit for generating a plurality of alignment control signals in response to a data strobe signal and a plurality of domain cross control signals in response to a clock signal, wherein external data are input in synchronism with the data strobe signal;
an alignment unit for aligning N-bit data of the input data by performing a data alignment operation at least one times with the plurality of alignment control signals; and
a domain cross unit for synchronizing outputs of the alignment unit with the domain cross control signals to output N-bit aligned data, N being an positive integer larger than one.

19. The input circuit of claim 18, wherein the control signal generating unit includes:
an alignment control signal generating unit for generating the plurality of alignment control signals in synchronism with a rising timing or a falling timing of the data strobe signal; and
a domain cross control signal generating unit for generating the plurality of domain cross control signals in synchronism with the clock signal in response to an activated enable signal.

20. The input circuit of claim 19, wherein the enable signal is activated when last data of the N-bit data is input into the input circuit.

21. The input circuit of claim 20, wherein the alignment unit includes:
a first alignment unit for aligning the internal data into first aligned data in two rows in synchronism with a first alignment control signal and a second alignment control signal output from the control signal generating unit; and
a second alignment unit for aligning the first aligned data into second aligned data in four rows in synchronism with a third alignment control signal.

22. The input circuit of claim 21, wherein the first alignment unit includes:
a latch unit for latching the internal data into the first aligned data to output a first to N/2th transferred data in response to the first and the second alignment control signal sequentially activated; and
a delay unit for delaying outputs of the first latch unit.

23. The input circuit of claim 22, wherein the latch unit includes a plurality of latches arranged in two lines, each of the latches latching an output of its previous latch in response to the first alignment control signal or the second alignment control signal and the first latches of the two lines receiving the internal data.

24. The input circuit of claim 23, wherein the delay unit includes a first to a fourth delay for respectively delaying the outputs of the latch unit for a predetermined time to output the delayed data to the second alignment unit.

25. The input circuit of claim 24, wherein the second alignment unit includes a first to a fourth latch for respectively latching outputs of the first to the fourth delays in the delay unit in synchronized with the third alignment control signal.

26. The input circuit of claim 25, wherein the domain cross unit includes eight latches for latching the outputs of the first to the fourth delays in the delay unit and outputs of the first to the fourth latches in the second alignment unit in synchronism with the domain cross control signal.

27. The input circuit of claim 26, wherein each latch of the domain cross unit and the first and the second alignment units is a D flip-flop or a circuit performing an edge triggering operation.

28. The input circuit of claim 24, wherein outputs of the plurality of latches in the latch unit are delayed with different delay times by the delays in the delay unit.

29. The input circuit of claim 28, wherein each delay in the delay unit includes a plurality of inverters connected in series.

30. The input circuit of claim 28, wherein each delay in the delay unit includes a resistor and a capacitor.

31. The input circuit of claim 30 further comprising:
a buffer unit for receiving the input data to output internal data into the alignment unit.

32. The input circuit of claim 18 wherein the domain cross unit includes N latches arranged in parallel for respectively latching the outputs of the alignment unit in synchronism with the domain cross control signals.

33. The input circuit of claim 32, wherein the alignment unit includes: a plurality of latches for latching the input data sequentially in synchronism with at least one selected signal among the plurality of alignment control signals; and a delay unit for delaying respective outputs of the plurality of latches.

34. The input circuit of claim 33 wherein the delay unit includes a plurality of delays in which outputs of the plurality of latches are delayed with different predetermined times.

35. The input circuit of claim 34, further comprising: a buffer unit for receiving the input data to output internal data into the alignment unit.

36. The input circuit of claim 32 wherein each latch of the domain cross unit and the alignment unit is a D flip-flop or a circuit performing an edge triggering operation.

37. An input circuit of a semiconductor memory device, the input circuit comprising:
a control signal generating unit for generating a first and a second alignment control signal and a plurality of domain cross control signals in response to a data strobe signal and a clock signal respectively, wherein external data are input in synchronism with the data strobe signal;
an alignment unit for aligning N-bits of the input data into data aligned in two rows in response to the first and the second alignment control signals; and
a domain cross unit for synchronizing the aligned data from the alignment unit with the plurality of domain cross control signals by performing a data synchronizing operation at least one times to output N-bit aligned data in parallel, N being a positive integer larger than one.

38. The input circuit of claim 37, wherein the control signal generating unit includes:
an alignment control signal generating unit for generating the first and the second alignment control signals in synchronism with a rising timing and a falling timing of the data strobe signal; and
a domain cross control signal generating unit for generating the plurality of domain cross control signals in synchronism with the clock signal in response to an activated enable signal.

39. The input circuit of claim 38, wherein the domain cross control signal generating unit includes:
an input unit for generating an internal clock signal using the clock signal and an inverted clock signal;
a first domain cross control signal generating unit for generating a first domain cross control signal in response to a first enable signal and the internal clock signal; and
a second domain cross control signal generating unit for generating a second domain cross control signal in response to a second enable signal and the internal clock signal.

40. The input circuit of claim 38, wherein the first domain cross control signal generating unit generates the first domain cross control signal by logically combining the internal clock signal and the first enable signal.

41. The input circuit of claim 40, wherein the input unit includes:
a buffer for receiving the clock signal and the inverted clock signal; and
a driver for generating the internal clock signal by using an output of the buffer and outputting the internal clock signal to the first domain cross control signal generating unit and the second domain cross control signal generating units.

42. The input circuit of claim 40, wherein the alignment control signal generating unit includes:
a buffer for receiving the data strobe signal and an inverted data strobe signal; and
a driver for generating the first and the second alignment control signals based on the output of the buffer.

43. The input circuit of claim 40, wherein the alignment unit includes: a latch unit for latching the input data into the first aligned data in two rows in response to the first and the second alignment control signals sequentially activated; and a delay unit for delaying outputs of the latch unit.

44. The input circuit of claim 43, wherein the latch unit includes a plurality of latches arranged in two lines, each of latches latching an output of its previous latch in response to the first alignment control signal or the second alignment control signal and the first latches of the two lines receiving the input data.

45. The input circuit of claim 44, wherein the latch unit includes:
a first latch for latching the internal data in response to the first alignment control signal;
a second latch for latching an output of the first latch to output as first aligned data in response to the second alignment control signal;
a third latch for latching the internal data to output as second aligned data in response to the second alignment control signal;
a fourth latch for latching an output of the second latch in response to the first alignment control signal;
a fifth latch for latching an output of the third second latch in response to the first alignment control signal;
a sixth latch for latching an output of the fourth latch to output as third aligned data in response to the second alignment control signal; and
a seventh for latching an output of the fifth latch to output fourth aligned data in response to the second alignment control signal.

46. The input circuit of claim 45, wherein the delay unit includes a plurality of delays in which outputs of the plurality of latches in the alignment unit are delayed with different values.

47. The input circuit of claim 46, wherein each delay of the delay unit includes a resistor and a capacitor.

48. The input circuit of claim 44, wherein the domain cross unit includes:
a pre-domain cross unit for aligning M-bit data selected from outputs of the alignment unit to output M-bit aligned data in response to the first domain cross control signal; and
a main domain cross unit for aligning outputs of the pre-domain cross unit to output the N-bit aligned data in N rows in response to the second domain cross control signal.

49. The input circuit of claim 48, wherein the pre-domain cross unit includes:
a first pre-domain cross unit for aligning first 4-bit data of the outputs of the alignment unit into data aligned in four rows in response to the first domain cross control signal; and
a second pre-domain cross unit for aligning second 4-bit data of the outputs of the alignment unit into data aligned in four rows in response to the first domain cross control signal.

50. The input circuit of claim 48, wherein the main domain cross unit includes N latches for aligning the outputs of the pre-domain cross unit to output the N-bit aligned data in response to the second domain cross control signal.

51. The input circuit of claim 48, wherein the first pre-domain cross unit includes four latches for aligning the first 4-bit data into the data aligned in four rows in response to the first domain cross control signal.

52. The input circuit of claim 51, wherein each latch of the first pre-domain cross unit is a D flip-flop or a circuit performing an edge triggering operation.

53. An input circuit of a semiconductor memory device for N-bit prefetch, the input circuit comprising:
  a first data alignment unit for aligning and outputting predetermined external data among N-bit data sequentially input in response to a first control signal generated in synchronism with a data strobe signal, wherein the N-bit data are input in synchronism with a transition timing of the data strobe signal;
  a latch unit for latching an output of the first data alignment unit in response to a second control signal generated in synchronism with a system clock; and
  a second alignment unit for aligning the output of the first data alignment unit and an output of the latch unit into N bit data aligned in parallel in response to a third control signal generated in synchronism with the system clock, wherein N is a positive integer larger than one.

54. The input circuit of the claim 53, wherein the second control signal is enabled in response to a first enable signal activated when the predetermined data are input and the third control signal is enabled in response to a second enable signal activated when the Nth data of the N-bit data is input.

55. An input circuit of a semiconductor memory device for N-bit prefetch, the input circuit comprising:
  a data alignment unit for aligning and outputting predetermined data among external N-bit data sequentially input;
  a first domain cross unit for latching the predetermined data output from an output of the data alignment unit in response to a first domain cross control signal in synchronism with the data strobe signal; and
  a second domain cross unit for latching the predetermined data output from the output of the data alignment unit and an output of the first domain cross unit into N-bit data aligned in parallel in response to a second domain cross control signal in synchronism with a system clock signal.

56. The input circuit of claim 55, further comprising:
  a domain cross control signal generating unit for generating the first domain cross control signal and the second domain cross control signals sequentially activated in synchronism with an external system clock input.

57. The input circuit of claim 56, further comprising: a data alignment control signal generating unit for generating a first data alignment signal and a second data alignment signal in synchronism with a rising timing and a falling timing of a data strobe signal, respectively, wherein the data alignment unit performs an alignment operation in response to the first and the second data alignment signals.

58. The input circuit of claim 57, wherein the domain cross control signal generating unit includes:
  an internal clock generating unit for generating an internal clock in synchronism with the system clock;
  a first control signal generating unit for generating the first domain cross control signal in response to the internal clock and a first enable signal; and
  a second control signal generating unit for generating the second cross control signal in response to the internal clock and a second enable signal.

59. The input circuit of claim 58, wherein the first enable signal is enabled when the predetermined data is input.

60. The input circuit of claim 59, wherein the second enable signal is enabled when the Nth data of the N-bit data is input.

61. The input circuit of claim 60, wherein the data alignment unit include: a first alignment unit for aligning the predetermined data to output first aligned data of two rows; and a second alignment unit for aligning the first aligned data into second aligned data.

62. The input circuit of claim 61, wherein the first domain cross unit includes a plurality of latches corresponding to the numbers of outputs of the second alignment unit.

63. The input circuit of claim 62, wherein the second alignment unit includes a plurality of delays corresponding to the bit number of the first aligned data.

64. The input circuit of claim 63, wherein the second domain cross unit includes a plurality of latches corresponding to the number of the outputs of the second alignment unit and that of outputs of the first domain cross unit.

65. A method for operating a semiconductor memory device for N-bit prefetch, the method comprising:
  aligning predetermined M-bit data among external N-bit data sequentially input to output first M-bit data in parallel by using an alignment unit in synchronism with a data strobe signal;
  latching the first M-bit data to output second data; aligning the remaining data among the N-bit data to output third data in parallel by using the alignment unit in synchronism with the data strobe signal; and
  aligning the second data and the third data in parallel to output aligned N-bit data in synchronism with a system clock signal.

66. The method of claim 65, wherein aligning the predetermined M-bit data includes:
  aligning the predetermined M-bit data to output data aligned in two rows; and
  aligning the data aligned in two rows to output the first M-bit data aligned in parallel.

67. The method of claim 66, wherein the first M-bit data are aligned in synchronism with a data strobe signal having a transition corresponding to an input timing of the N-bit data.

68. The method of claim 67, wherein the second data are latched in response to a first control signal in synchronism with a system clock.

69. The method of claim 67 wherein the N-bit data are aligned in response to a second control signal in synchronism with a system clock.

* * * * *